United States Patent [19]
Abrokwah et al.

[11] Patent Number: 5,606,184
[45] Date of Patent: Feb. 25, 1997

[54] HETEROSTRUCTURE FIELD EFFECT DEVICE HAVING REFRACTORY OHMIC CONTACT DIRECTLY ON CHANNEL LAYER AND METHOD FOR MAKING

[75] Inventors: Jonathan K. Abrokwah, Tempe; Jenn-Hwa Huang, Gilbert; William J. Ooms, Chandler, all of Ariz.; Carl L. Shurboff, Grayslake, Ill.; Jerald A. Hallmark, Gilbert, Ariz.

[73] Assignee: Motorola, Inc., Schaumburg, Ill.

[21] Appl. No.: 434,867

[22] Filed: May 4, 1995

[51] Int. Cl.$^6$ ............... H01L 31/0328; H01L 31/0336; H01L 31/072; H01L 31/109
[52] U.S. Cl. ..................... 257/192; 257/194; 257/27
[58] Field of Search ................. 257/27, 194, 192

[56] References Cited

U.S. PATENT DOCUMENTS

| | | |
|---|---|---|
| 3,684,930 | 8/1972 | Collins et al. |
| 4,188,710 | 2/1980 | Davey et al. |
| 4,313,971 | 2/1982 | Wheatley, Jr. |

(List continued on next page.)

FOREIGN PATENT DOCUMENTS

| | | |
|---|---|---|
| 2359640 | 6/1975 | Germany. |
| 5984580 | 5/1984 | Japan. |
| 2149125 | 12/1985 | Japan. |
| 2149138 | 12/1985 | Japan. |
| 6395620 | 10/1986 | Japan. |

OTHER PUBLICATIONS

E. Kolawa et al., "Stable Solid–Phase Contact to n–GaAs", IEEE Transactions on Electron Devices, vol. 36, No. 6, Jun. 1989, pp. 1223–1225.

C. C. Han et al., "Thermally stable and nonspiking Pd/Sb(Mn) ohmic contact to p–GaAs", Appl. Phys. Lett. 58(15), 15 Apr. 1991, pp. 1617–1619.

R. J. Graham et al., "Investigation of the Structural and Electrical Properties of Al–Ge–Ni Contacts to GaAs", Journal of Electronics Materials, vol. 19, No. 11, 1990, pp. 1257–1263.

Hallali et al., "Thermally stable In–based ohmic contacts to p–type GaAs", Proceedings of the 18th International Symposium on Gallium Arsenide and Related Compounds, Sep. 1991, pp. 179–182.

D. Davito et al., "Ohmic Contacts to p–and n–type GaAs Made with Al–Sn–Ni", Journal of the Electrochemical Society, vol. 140, No. 5, May 1993, pp. 1450–1453.

M. Murakami, Indium Based Ohmic Contacts To n and p–Type GaAs'–the whole document, Extended Abstracts, No. 437, Oct. 1990, p. 638.

T. C. Shen et al., Recent Developments in Ohmic Contacts for III–V Compound Semiconductors, Journal of Vacuum Science and Technology: Part B, vol.10, No. 5, Oct. 1992, pp. 2113–2132.

M. Murakami et al., Thermally Stable, Low–Resistance NilnWNx, Ohmic Contacts to N–Type GaAs, Prepared By Sputter Deposition, Applied Physics Letters, vol. 59, No. 4, Nov. 1991.

E. Kolawa et al., "Solid Phase Ni/Ge Ohmic Contacts to GaAs with W–N Diffusion Barriers", Journal of Electrochemical Society, vol. 133, No. 9, Sep. 1986, the whole document.

(List continued on next page.)

*Primary Examiner*—Stephen Meier
*Attorney, Agent, or Firm*—Aaron B. Bernstein; George C. Chen

[57] ABSTRACT

A complementary III-V heterostructure field effect device includes the same refractory ohmic material for providing the contacts (117, 119), to both the N-type and P-type devices. Furthermore, the refractory ohmic contacts (117, 119) directly contact the InGaAs channel layer (16) to provide improved ohmic contact, despite the fact that the structure incorporates an advantageous high aluminum composition barrier layer (18) and an advantageous GaAs cap layer (20).

20 Claims, 3 Drawing Sheets

U.S. PATENT DOCUMENTS

| | | |
|---|---|---|
| 4,540,446 | 9/1985 | Nonaka et al. . |
| 4,712,291 | 12/1987 | McLevige . |
| 4,729,000 | 3/1988 | Abrokwah . |
| 4,746,627 | 5/1988 | Zuleeg . |
| 4,814,851 | 3/1989 | Abrokwah et al. . |
| 4,830,980 | 5/1989 | Hsieh . |
| 4,833,042 | 5/1989 | Waldrop et al. . |
| 4,989,065 | 1/1991 | Tsuchimoto et al. . |
| 4,998,158 | 3/1991 | Johnson et al. . |
| 5,045,502 | 9/1991 | Lau et al. . |
| 5,060,031 | 10/1991 | Abrokwah et al. . |
| 5,091,338 | 2/1992 | Tsuchimoto et al. . |
| 5,093,280 | 3/1992 | Tully . |
| 5,100,835 | 3/1992 | Zheng . |
| 5,116,774 | 5/1992 | Huang et al. . |
| 5,144,410 | 9/1992 | Johnson . |
| 5,214,298 | 5/1993 | Yuan et al. . |
| 5,275,971 | 1/1994 | Wu et al. . |
| 5,281,842 | 1/1994 | Yasuda et al. . |
| 5,389,564 | 2/1995 | Bernhardt et al. . |

OTHER PUBLICATIONS

S. Swirhun et al., "P–and N–channel InAlAs/InGaAs Heterojunction Insulated Gate FETs (HIGFETs) on InP", Third Int. Conf. Indium Phosphide and Related Materials, 8 Apr. 1991, Cardiff, Wales, UK, pp. 238–241 (the whole document).

R. J. Graham et al., "Preliminary Studies of Al–Ge–Ni Ohmic Contacts to P–and n–type GaAs", Journal of the Electrochemical Society, Jan. 1988, Manchester, New Hampshire, US, vol. 135, No. 1, pp. 266–267.

N. Lustig et al., "Low Au content thermally stable NiGe(Au)W ohmic contacts to n–type GaAs", Applied Physics Letters, 13 May 1991, New York, US, vol. 58, No. 19, pp. 2093–2095.

R. J. Roedel et al., "Ohmic Contacts to p–and n–type GaAs Made with Al–Sn–Ni", Journal of the Electrochemical Society, May 1993, Manchester, New Hampshire, US, vol. 140, No.5, pp. 1450–1453 (p. 1450).

IBM Technical Disclosure Bulletin, Jan. 1992, New York, US, vol. 34, No. 8, pp. 470–475 (p. 473).

HETEROSTRUCTURE FIELD EFFECT DEVICE HAVING REFRACTORY OHMIC CONTACT DIRECTLY ON CHANNEL LAYER AND METHOD FOR MAKING

BACKGROUND OF THE INVENTION

The present invention relates, in general, to heterostructure field effect devices, and more particularly, to heterostructure field effect devices having refractory ohmic contacts directly on the channel layer.

III-V heterostructure field effect devices often use a low band gap, high mobility material, such as GaAs or InGaAs as a carrier channel. Furthermore, such devices often employ an aluminum containing barrier layer above the channel layer, such as AlGaAs or AlInAs. Recently, refractory ohmics such as NiGeW, NiInW and GeNiW have been used for source and drain contacts on III-V heterostructure field effect devices. The refractory ohmics are preferable to gold based materials which have been used in the past because the refractory ohmics form limited reaction contacts to semiconductors, and exhibit nonspiking interfaces with the semiconductor.

Unfortunately, refractory ohmics do not make particularly good ohmic contact to aluminum containing barrier layers which typically cover the channel layer of a III-V heterostructure field effect device. This problem is particularly severe when aluminum composition in the barrier layer is more than twenty percent. The problem is due to high reactivity of aluminum containing compounds, i.e. oxides are readily formed on the aluminum containing barrier layer. The oxides formed on the barrier layer seriously degrade contact resistance of the refractory ohmic, since they impede the reaction of the metal and the semiconductor.

Sometimes, a GaAs cap layer is formed over the aluminum containing barrier layer in order to prevent the formation of oxides. Given such a structure, the refractory ohmic may be formed on the GaAs cap layer. However, since the high aluminum mole fraction barrier layer beneath the cap layer inherently has relatively low doping, tunneling resistance increases significantly across the residual barrier layer, resulting in poor ohmics.

What is needed is a structure and method for making a structure which employs the advantageous refractory ohmics but avoids contact to a high aluminum composition barrier layer or GaAs cap layer. Such a structure and method would be particularly useful in the context of a III-V complementary heterostructure device wherein a high aluminum composition and GaAs cap are nevertheless required.

DETAILED DESCRIPTION OF THE DRAWINGS

Generally stated, a preferred embodiment of the present invention is a complementary GaAs heterostructure insulated gate field effect transistor (CGaAs™ HIGFET) which overcomes the drawbacks of the prior art and establishes a manufacturable device and process compatible with modern VLSI interconnect technology. The preferred embodiment accomplishes this by employing a refractory ohmic contact, specifically NiGeW, NiInW or GeNiW for both the N-type and P-type devices on the structure. Furthermore, the advantages are accomplished by arranging the structure so that the refractory ohmic directly contacts the channel layer, even though the device employs a high aluminum composition barrier layer and a GaAs cap layer.

Figure 1:
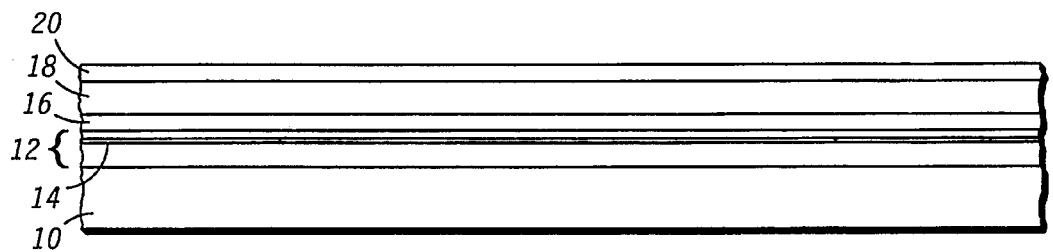
FIG. 1 is a cross-section view of a portion of a substrate of the preferred embodiment of the present invention.

Turning to the drawings for a more detailed understanding of the structure and method for making, FIG. 1 is a schematic cross-section illustrating the epitaxial semiconductor structure of the preferred embodiment of the present invention. A GaAs substrate 10 is provided. The GaAs substrate 10 is a high resistance material, preferably the type grown by liquid encapsulated Czochralski (LEC) technique. The GaAs substrate 10 is preferably about 25 mils in thickness, and has a sheet resistance of approximately $10^9$ to $10^{10}$ ohms/sq. An undoped GaAs buffer layer 12 is epitaxially grown, in a manner well known in the art, on the GaAs LEC substrate 10. The GaAs buffer layer 12 is preferably approximately 2,000 Å thick. The GaAs buffer layer 12 is for providing a clean crystal lattice from which to form the active layers of the device. Within the GaAs buffer layer 12, a very narrow delta doping layer 14 is inserted. The delta doping layer 14 preferably comprises silicon (Si), having a carrier concentration of less than $10^{12}$ cm$^{-2}$ for enhancement-mode devices. In the preferred embodiment, the delta doping layer 14 is disposed approximately 30 Å from the top of the GaAs buffer layer 12. The doping layer 14 functions to provide part of the carriers to the N-channel device and to adjust the threshold voltage of both N-channel and P-channel devices.

An FET channel layer 16 is formed above the GaAs buffer layer 12. The channel layer 16 preferably comprises undoped InGaAs having a mole ratio of 20% In, 80% Ga. In the preferred embodiment, the channel layer 16 is approximately 130 Å thick.

On top of the channel layer 16, an barrier layer 18 is epitaxially grown. Preferably, the barrier layer 18 comprises undoped AlGaAs. The preferred molar ratio is 75% Al, 25% Ga. The layer has a thickness of approximately 250 Å.

An undoped GaAs cap layer 20 is grown above the barrier layer, to a thickness of approximately 30 Å. The GaAs cap layer is for preventing the oxidation of the AlGaAs barrier layer 18.

Thus, the epitaxial semiconductor structure of FIG. 1 provides a heterostructure for forming the preferred complementary heterostructure field effect transistor device. As is apparent, the heterostructure comprises GaAs/InGaAs/AlGaAs. Additionally, a GaAs cap layer is formed over the AlGaAs barrier layer in the preferred embodiment.

FIGS. 2–9 illustrate the preferred method of the present invention which results in the preferred complementary heterostructure field effect transistor.

Figure 2:
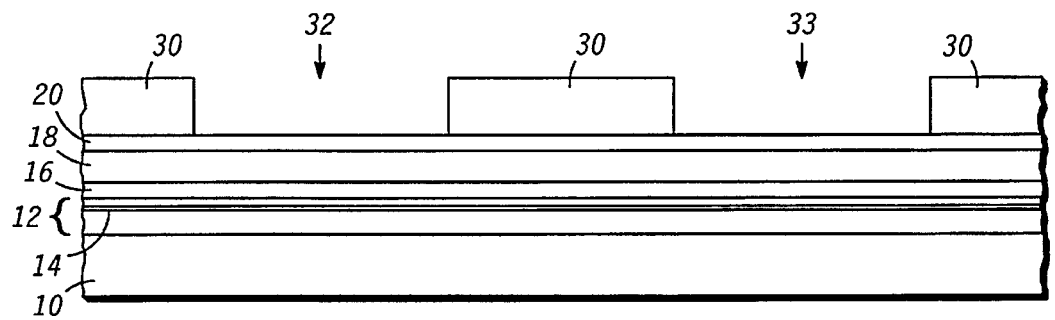
FIG. 2 is a cross-section view illustrating the preferred method of the present invention just after an optional field dielectric is deposited.

Referring to FIG. 2, an optional field dielectric 30 is deposited to protect the substrate material. Windows are opened in the field dielectric 30 with well known lithographic and reactive ion etching (RIE) techniques. The windows provide access to active device regions 32 and 33.

Figure 3:
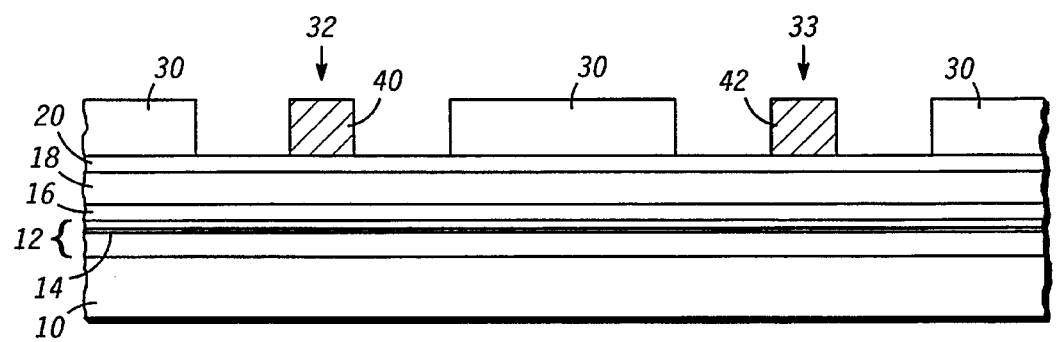
FIG. 3 is a cross-section view illustrating the preferred method of the present invention just after device gates are formed.

Referring to FIG. 3, an N-device gate 40 and a P-device gate 42 are formed in regions 32 and 33, respectively. Specifically, in the preferred embodiment a layer of TiWN of approximately 3,000 to 4,000 Å is reactively RF sputter deposited. The TiWN serves as Schottky contact gates for the field effect devices. Gates 40 and 42 are defined by RIE techniques with a mixture of $SF_6$, $CHF_3$ and He, or any suitable chemistries well known in the art.

Figure 4:
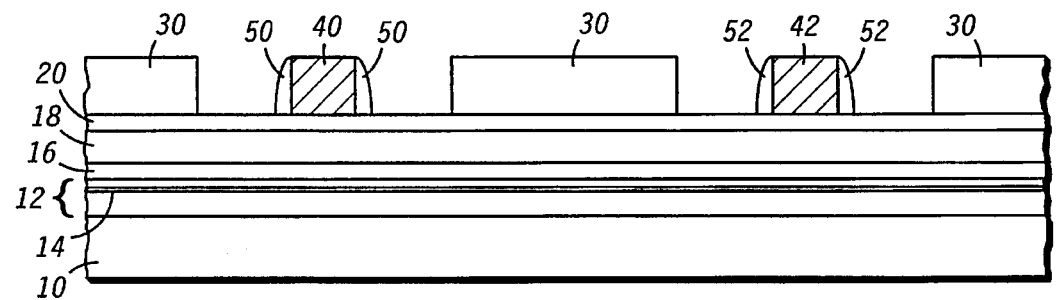
FIG. 4 is a cross-section view illustrating the preferred method of the present invention just after optional gate sidewalls are formed.

FIG. 4 illustrates the forming of pairs of sidewall spacers 50 and 52 on opposing sides of gates 40 and 42, respectively. The sidewalls 50 and 52 are preferable, but not necessary. The sidewalls 50 and 52 function to align the source and drain regions in later steps, so as to enhance performance parameters of the overall device. In the preferred embodiment, the sidewalls 50 and 52 are formed of SiON or $SiN/SiO_2$, with total thickness of approximately 4,000 Å. The sidewalls 50 and 52 are formed with common processing methods. A high pressure anisotropic RIE process is used for etching. The resulting sidewalls 50 and 52 have a footprint alongside the respective gates of approximately 3,000 Å following the RIE.

Figure 5:
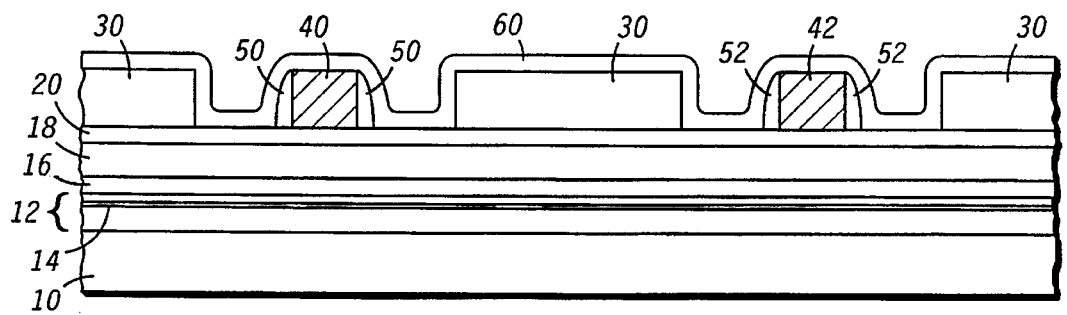
FIG. 5 is a cross-section view illustrating the preferred method of the present invention just after a protective dielectric layer is formed.

FIG. 5 illustrates the deposition of a protective SiN layer 60 covering the field dielectric regions 30, the active device regions 32,33, the gates 40,42, along with the spacers 50,52. The SiN layer 60 functions to protect the wafer surface from the subsequent process steps. The layer 60 is preferably deposited with standard CVD methods to a thickness of approximately 500 Å.

Figure 6:
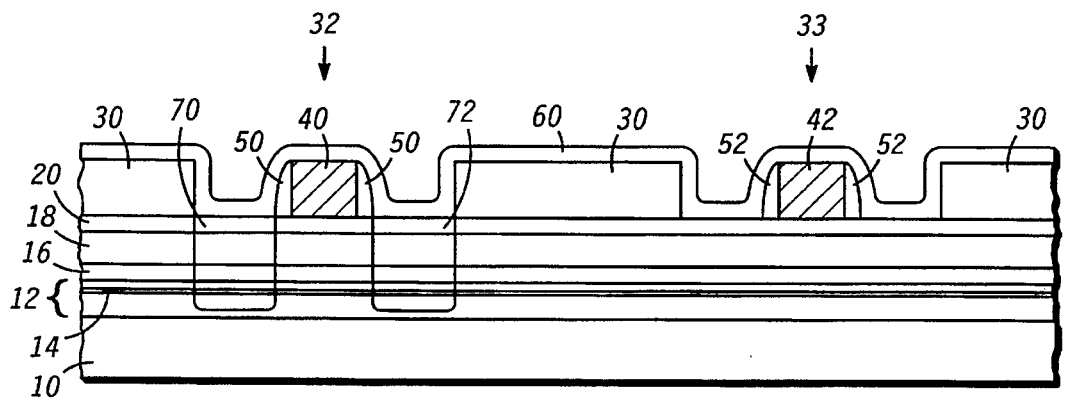
FIG. 6 is a cross-section view illustrating the preferred method of the present invention just after N-source and N-drain regions are formed.

FIG. 6 illustrates the forming of an N-source region 70 and an N-drain region 72 in the active device region 32 adjacent the N-device gate 40. The regions 70 and 72 are formed with well known processing methods using Si implantation to yield a sheet resistance of approximately 350 ohms/sq or lower. The implantation is through the SiN layer 60. N-source region 70 and N-drain region 72 each preferably extend approximately 2,000 Å into the substrate, thus extending at least to the channel layer 16, and preferably into buffer layer 12. Optionally, a lightly doped region may be provided directly self-aligned to the N-device gate 40, with a lower dose Si implant, prior to the sidewall formation, to improve the breakdown voltage of the N-channel FET.

Figure 7:
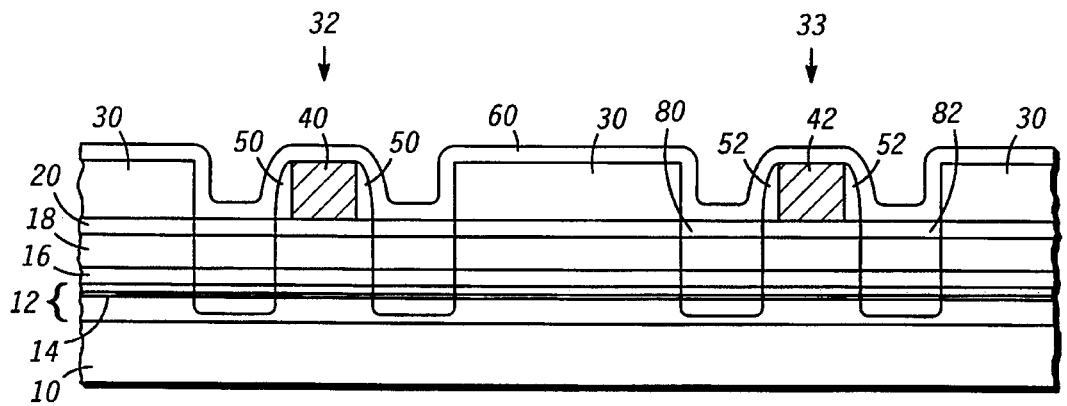
FIG. 7 is a cross-section view illustrating the preferred method of the present invention just after P-source and P-drain regions are formed.

FIG. 7 illustrates the forming of P-source region 80 and P-drain region 82 in the active region 33 adjacent the P-device gate 42. The P-regions 80 and 82 are formed using co-implantation of fluorine (F) and beryllium (Be) to provide a sheet resistance of approximately 1,000–2,000 ohms/sq. P-source region 80 and P-drain region 82 each preferably extend approximately 2,000 Å into the substrate, thus extending at least to the channel layer 16, and preferably into buffer layer 12.

Figure 8:
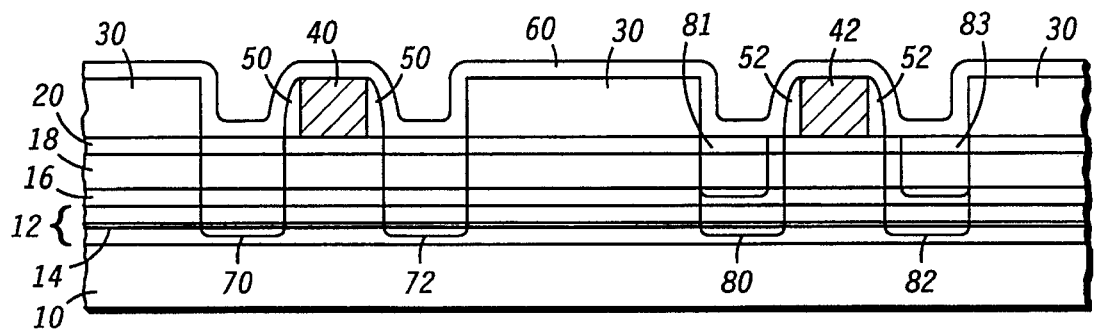
FIG. 8 is a cross-section view illustrating the preferred method of the present invention just after P-source and drain regions are further doped.

FIG. 8 illustrates the further doping of the P-source region 80 and the P-drain region 82 so as to make the regions compatible for the ohmic contact used in the preferred embodiment of the present invention. Specifically, NiGeW, NiInW, or GeNiW are normally only used as N-type ohmic contact metal due to the incorporation of Ge, which is an N-type dopant for GaAs. However, the present invention utilizes NiGeW, NiInW, or GeNiW as the P-type ohmic contact as well. Consequently, in the step illustrated by FIG. 8, the P-type source region 80 and the P-type drain region 82 are further heavily doped so as to provide a shallow concentration in P-type regions 80 and 82 and a high concentration in P-type regions 81 and 83. A resulting sheet resistivity of less than 400 ohms/sq is preferred.

The optimized P-type dopant profile may be achieved using co-implantation of F and Be, As and Be, P and Be, N and Be or Kr and Be. The co-implantation improves the activation of Be and reduces diffusion rate of the Be. In the case of F and Be, peak doping of greater than $1\times10^{19}$ cm$^{-1}$ is achieved with implant doses above $10^{14}$ cm$^{-2}$ and energies under 50 keV with rapid annealing temperatures, referred to below, of 700°–850° C. Thus, a P-type contact is provided even though an N-type ohmic metal is used.

Although not shown, the next step in the preferred method is a rapid thermal annealing which is used to activate the P and N source and drains. The annealing conditions are preferably temperatures of around 850° C. and designed to minimize slip-line generation on large wafers and to reduce P-type HFET sub-threshold currents.

Figure 9:
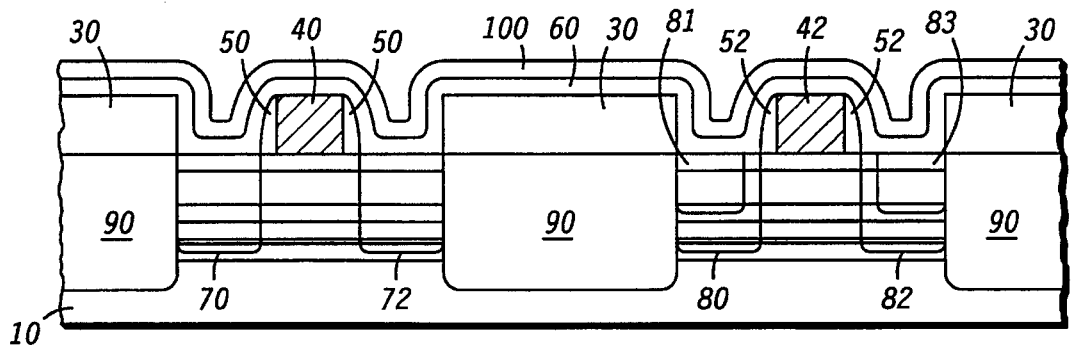
FIG. 9 is a cross-section view illustrating the preferred method of the present invention just after isolation regions are formed.

FIG. 9 illustrates the forming of oxygen isolation (ISO) regions 90 in the epitaxial substrate, between the N-channel device and the P-channel device. The ISO regions 90 functions to electrically isolate the respective devices. It will be understood that the N-device and P-device shown are two of many identical devices formed on a particular die. Consequently, regions 90 are shown at the edges of the figure to indicate isolation from neighboring devices not shown. The ISO uses a rapid thermal annealing which is preferably carried out at near 600° C. for less than 10 seconds.

FIG. 9 also illustrates an additional dielectric cap 100 covering the whole device. The cap 100 is provided for protection during further processing steps. The dielectric cap 100 is formed using conventional processing methods to a thickness of approximately 3,500 Å.

Figure 10:
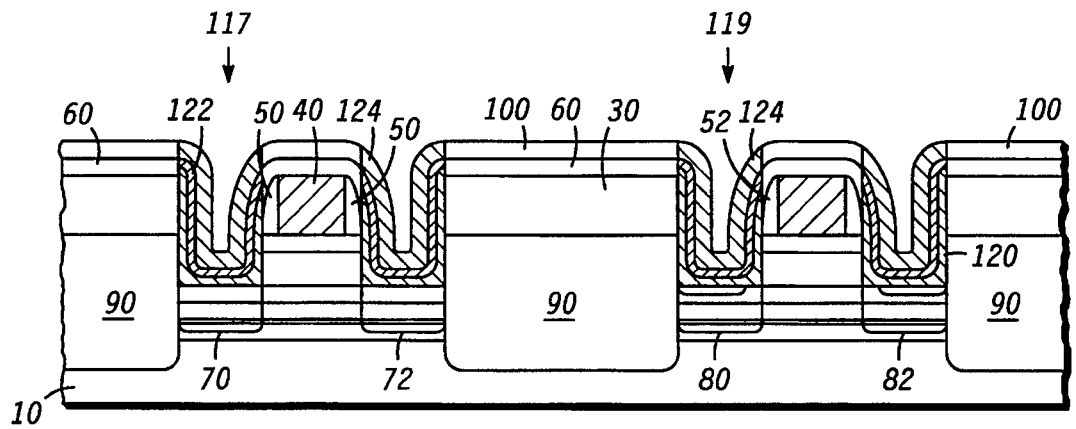
FIG. 10 is a cross-section view illustrating the preferred method of the present invention just after ohmic contacts are formed.

FIG. 10 illustrates particularly important features of the preferred embodiment of the present invention. More specifically, FIG. 10 illustrates the ohmic contacts of the preferred embodiment of the present invention making direct contact to InGaAs channel layer 16.

Although not shown, the dielectric layer 100 and the dielectric layer 60 have been etched away in areas of the N-source, N-drain, P-source, P-drain regions 70, 72, 80 and 82, respectively, to provide access for deposition of the ohmic contacts. Additionally, the GaAs cap layer 20 has been removed using a selective wet etch such as citric acid or a suitably dry etchant such as methane/hydrogen argon mixtures.

Subsequently, the AlGaAs barrier layer 18 has been removed to expose channel layer 16. Barrier layer 18 is preferably etched with a selective etch such as $HCl/H_2O$ mixture, or selectively dry-etched with etchants such as $SF_6/SiCl_4$ or $SF_6/BCl_3$. The selective etch tends to etch AlGaAs at a much higher rate (greater than 10 times) compared to InGaAs which makes up the channel layer.

Ni layer 120, Ge layer 122 and W layer 124 are sputtered deposited over the whole device, and the contact areas are defined. For ease of description, the ohmic contact to the N-source region 70 is referred to as refractive ohmic contact 117 or ohmic region 117. Similarly, the contact to P-source region 80 is referred to as refractory ohmic contact 119 or ohmic region 119. These exemplify all the ohmic contacts.

Exemplary ohmic regions 117 and 119 are formed as follows. In an embodiment employing lift-off techniques to define the contact regions, thin layers are required for the metals. In this case, Ni layer 120 is less than 300 Å and Ge layer 122 is less than 300 Å. Finally, W layer 124 is deposited to a thickness of approximately 1,000 Å.

Note that employing etching to define contact regions is also desirable. Any reasonable W thickness can be used when the contacts are defined with etching techniques, such as RIE of the W and Ge and well known chemicals such as buffered oxide etchant (BOE) or hydrochloric acid (HCl) for the nickel. Acceptable techniques are disclosed in U.S. Pat. No. 5,387,548, issued to Cho on Feb. 7, 1995 although others may be employed.

For the N-channel regions, the ohmic contact material works suitably for the Si doped N-type source and drain regions, so long as the sheet resistivity is less than 1,000 ohms/sq. The ohmic contacts are sputter deposited on the implanted and annealed semiconductor after initial pre-cleaning using wet etching with BOE and HCl.

When sintered in the temperature range 500° C. to 600° C., stable NiGe and NiAs compounds form an interface of the ohmic metal and the semiconductor material. The NiAs compound may form at lower temperatures and may be interspersed in the NiGe matrix. Both these compounds form low barriers to the semiconductor allowing tunneling conduction.

In order to use the NiGeW ohmic contacts for P-type devices, a high concentration of P-type doping is provided in the P-type III-V heterostructure by shallow ion implantation process, as described above with reference to FIG. 8. This ensures that the NiGeW metal contacts a highly doped P-type region despite diffusion of the N-type Ge dopants into the semiconductor.

The W layer 124, which is a refractory metal, may optionally be a different stable refractory metal such as WN, TiW, or TiWN. The refractory cap provides a barrier to As diffusion into Al metallization which may be employed in VLSI interconnection as discussed previously.

By now it should be appreciated that there has been provided a novel and non-obvious III-V heterostructure field effect device and method for making the same. The device is particularly advantageous because it utilizes refractory ohmic contacts which are particularly compatible to VLSI aluminum interconnect techniques and process temperatures. Furthermore, the refractory ohmic contacts directly contact the channel layer despite the fact that the structure and method incorporates the use of a high aluminum composition barrier layer and a GaAs cap layer.

We claim:

1. A field effect device comprising:

a channel layer;

a barrier layer comprising aluminum, the barrier layer overlying the channel layer, the barrier layer absent over a contact portion of the channel layer;

an undoped cap layer overlying the barrier layer, the undoped cap layer absent over the contact portion of the channel layer; and a first refractory ohmic contact comprising a first material, the refractory ohmic contact contacting the contact portion of the channel layer.

2. The device of claim 1, wherein the channel layer comprises a material selected from the group consisting of GaAs and InGaAs.

3. The device of claim 1, wherein the barrier layer comprises material selected from the group consisting of AlGaAs and AlInAs.

4. The device of claim 1, wherein the barrier layer comprises an aluminum composition greater than about 15 percent.

5. The device of claim 1, wherein the device comprises a HIGFET comprising a P-contact and an N-contact, and wherein the first refractory ohmic contact contacts the P-contact and a second refractory ohmic contact comprising the first material contacts the N-contact.

6. The device of claim 1, wherein the first material is selected from the group consisting of NiGeW, NiInW and GeNiW.

7. The device of claim 1 wherein the first refractory ohmic contact contacts a portion of the barrier layer and a portion of the undoped cap layer.

8. The device of claim 1 wherein the barrier layer is undoped.

9. The device of claim 1 wherein the undoped cap layer comprises GaAs and overlies a portion of the channel layer.

10. A semiconductor device comprising:

a heterostructure substrate having a buffer layer, a delta doping layer within the buffer layer, a channel layer overlying the buffer layer, and a barrier layer overlying the channel layer, the barrier layer comprising aluminum;

a source region in a first portion of the channel layer, the barrier layer absent over the source region;

a drain region in a second portion of the channel layer, the barrier layer absent over the drain region;

a first refractory ohmic contact contacting the source region, the first refractory ohmic contact comprised of a plurality of refractory layers; and a second refractory ohmic contact contacting the drain region, the second refractory ohmic contact comprised of the plurality of refractory layers.

11. The semiconductor device of claim 10 further comprising:

a different source region in a third portion of the channel layer, the different source region having a first conductivity type;

a different drain region in a fourth portion of the channel layer, the different drain region having the first conductivity type;

a third refractory ohmic contact contacting the different source region, the third refractory ohmic contact comprised of the plurality of refractory layers; and a fourth refractory ohmic contact contacting the different drain region, the fourth refractory ohmic contact comprised of the plurality of refractory layers, wherein the source region and the drain region have a second conductivity type different from the first conductivity type.

12. A semiconductor device comprising:

a heterostructure substrate having a buffer layer, a channel layer overlying the buffer layer, and a barrier layer overlying the channel layer, the barrier layer comprising aluminum;

a source region in a first portion of the channel layer, the barrier layer absent over the source region;

a drain region in a second portion of the channel layer, the barrier layer absent over the drain region;

a first refractory ohmic contact contacting the source region, the first refractory ohmic contact comprised of a plurality of refractory layers;

a second refractory ohmic contact contacting the drain region, the second refractory ohmic contact comprised of the plurality of refractory layers; and a cap layer overlying the barrier layer and the channel layer, the cap layer absent over the source and drain regions.

13. The semiconductor device of claim 12 wherein the cap layer is undoped, wherein the barrier layer is undoped, and wherein the buffer layer is delta doped.

14. The semiconductor device of claim 12 further comprising a gate electrode overlying the channel layer, the barrier layer, and the cap layer.

15. The semiconductor device of claim 12 wherein the first and second refractory ohmic contacts each contact different portions of the barrier layer and the cap layer.

16. A semiconductor device comprising:

a substrate;

a buffer layer overlying the substrate;

a channel layer overlying the buffer layer;

a barrier layer overlying the channel layer, the barrier layer comprised of aluminum;

a cap layer overlying the barrier layer;

a first drain region located in a first portion of the channel layer and a first portion of the buffer layer, the first drain region having a first conductivity type, the cap layer and the barrier layer absent over the first drain region;

a first source region located in a second portion of the channel layer and a second portion of the buffer layer, the first source region having the first conductivity type, the cap layer and the barrier layer absent over the first source region;

a first refractory ohmic contact contacting the first drain region, the first refractory ohmic contact comprised of a plurality of refractory metals; and a second refractory ohmic contact contacting the first source region, the second refractory ohmic contact comprised of the plurality of refractory metals.

17. The semiconductor device of claim 16 wherein the buffer layer is delta doped, wherein the barrier layer is undoped, wherein the cap layer is undoped, and wherein the substrate, the buffer layer, the channel layer, the barrier layer, and the cap layer comprise a heterostructure substrate.

18. The semiconductor device of claim 16 further comprising a gate electrode overlying the barrier layer and the cap layer, wherein the cap layer overlies the channel layer.

19. The semiconductor device of claim 16 further comprising:

a second drain region having a second conductivity type, the second drain region located in a third portion of the channel layer and a third portion of the buffer layer, the cap layer and the barrier layer absent over the second drain region;

a second source region having the second conductivity type, the second source region located in a fourth portion of the channel layer and a fourth portion of the buffer layer, the cap layer and the barrier layer absent over the second source region;

a third refractory ohmic contact contacting the second drain region, the third refractory ohmic contact comprised of the plurality of refractory metals; and a fourth refractory ohmic contact contacting the second source region, the fourth refractory ohmic contact comprised of the plurality of refractory metals.

20. The semiconductor device of claim 16 wherein the first refractory ohmic contact contacts a first portion of the cap layer and a first portion of the barrier layer and wherein the second refractory ohmic contact contacts a second portion of the cap layer and a second portion of the barrier layer.

* * * * *